US006375860B1

United States Patent
Ohkawa et al.

(10) Patent No.: US 6,375,860 B1
(45) Date of Patent: Apr. 23, 2002

(54) CONTROLLED POTENTIAL PLASMA SOURCE

(75) Inventors: Tihiro Ohkawa, La Jolla; Stanley I. Tsunoda, Encinitas, both of CA (US)

(73) Assignee: General Atomics, San Diego, CA (US)

( * ) Notice: Subject to any disclaimer, the term of this patent is extended or adjusted under 35 U.S.C. 154(b) by 0 days.

(21) Appl. No.: 08/401,869

(22) Filed: Mar. 10, 1995

(51) Int. Cl.[7] .............................. C23F 1/00; H05H 1/24; C23C 16/00; C23C 14/00

(52) U.S. Cl. .............................. 216/71; 216/63; 216/65; 216/69; 216/70; 156/345; 427/569; 427/570; 427/571; 427/572; 427/575; 427/585; 427/586; 427/595; 427/596; 427/598; 118/723 R; 118/723 MN; 118/723 MR; 118/723 MA; 118/723 E; 204/192.12; 204/298.06; 204/298.09; 204/298.16; 204/298.31; 204/298.34; 204/298.37; 204/298.38

(58) Field of Search .............................. 216/63, 65, 67, 216/69, 70, 71; 427/569, 570, 571, 572, 575, 585, 586, 595, 596, 598; 156/345; 204/298.06, 298.07, 298.08, 298.16, 298.31, 298.33, 298.34, 298.37, 298.38, 192.1, 192.12; 118/723 R, 723 MW, 723 MR, 723 MA, 723 AN, 723 E, 723 I

(56) References Cited

U.S. PATENT DOCUMENTS

| 4,657,619 A | * | 4/1987 | O'Donnell | 156/345 |
| 4,657,629 A | * | 4/1987 | O'Donnell | 156/345 |
| 4,664,938 A | * | 5/1987 | Walker | 118/723 E |
| 4,891,095 A | * | 1/1990 | Ishida et al. | 204/298.38 |
| 4,962,727 A | * | 10/1990 | Harada | 118/723 R |

(List continued on next page.)

OTHER PUBLICATIONS

Watanabe, et al., "Effects of Low–Frequency Modulation on RF Discharge Chemical Vapor Depositoin", *Appl. Phys. Lett.*, 53(14) pp. 1263–1265 (Oct. 3, 1988).

Selwyn, "Plasma Particulate Contamination Control. I. Transport and Process Effects", *J. Vas. Sci. Technol. B.*, 9:6 pp. 3487–3492 (Nov./Dec., 1991).

(List continued on next page.)

*Primary Examiner*—Rodney G. McDonald
(74) *Attorney, Agent, or Firm*—Fitch, Even, Tabin & Flannery

(57) ABSTRACT

The occurrence of internally-formed contaminants or negatively-charged particulates within a plasma is minimized by preventing such from becoming trapped in the plasma. The plasma is formed in a plasma chamber having control electrodes and reference electrodes. The control electrodes are biased with a negative potential. The plasma assumes a potential more positive than the control electrodes. The reference electrodes are then biased to be more positive than the plasma. Hence, negative ions or negatively-charged particulates in the plasma are attracted to the more positive reference electrodes, and thus escape the plasma without being trapped therein, and are not available to serve as nucleation or agglomeration points for contaminants. A pair of Helmholtz coils produce a magnetic field having magnetic field lines that run longitudinally between the control electrodes. The magnitude of the magnetic field is sufficiently strong to confine electron current only along the magnetic field lines, yet sufficiently weak to allow negative ion current and negatively-charged particulates to cross the magnetic field lines. Because the plasma current density is dominated by electron current as opposed to ion current (due to the higher thermal velocity of electrons compared to ions), and because electron current is controlled only through the control electrodes, the plasma is effectively controlled by the potential applied to the control electrodes.

35 Claims, 5 Drawing Sheets

U.S. PATENT DOCUMENTS

| | | | | |
|---|---|---|---|---|
| 5,045,166 A | * | 9/1991 | Bobbio | 156/345 |
| 5,225,740 A | | 7/1993 | Ohkawa | 313/111 |
| 5,284,544 A | * | 2/1994 | Mitzutani et al. | 156/345 |
| 5,350,454 A | | 9/1994 | Ohkawa | 118/723 |
| 5,359,621 A | | 10/1994 | Tsunoda et al. | 372/82 |
| 5,361,016 A | | 11/1994 | Ohkawa et al. | 315/111 |
| 5,387,777 A | | 2/1995 | Bennett et al. | 219/121 |
| 5,527,394 A | * | 6/1996 | Heinrich et al. | 118/723 E |

OTHER PUBLICATIONS

Selwyn, Plasma Particulate Contamination Control. II. Self-Cleaning Tool Design; *J. Vac. Sci. Technol. B.*, 10:4 pp. 1053–1059 (Jul./Aug., 1992).

Hollenstein, et al., "Diagnostics of Particle Genesis and Growth in RF Silane Plasmas by Ion Mass Spectrometry and Light Scattering", *NATO Advanced Research Workshop* entitled "Formation, Transport and Consequences of Particles in Plasmas", Château de Bonas, France, Aug. 30 through Sep. 3, 1993.

Hollenstein, et al., "Diagnostics of Particle Genesis and Growth in RF Silane Plasmas by Ion Mass Spectrometry and Light Scattering", *Centre de Recherches en Physique des Plasmas*, Ecole Polytecnique Fédérale de Lausanne, Lausanne, Switzerland, pp. 278–285 (published 1994).

* cited by examiner

CONTROLLED POTENTIAL PLASMA SOURCE

BACKGROUND OF THE INVENTION

The present invention relates to plasma processing apparatus and methods, and more particularly to plasma processing apparatus and methods that use a controlled potential plasma source in order to minimize particulate formation within the plasma.

In recent years, plasma processing has emerged as one of the most versatile and efficient techniques for the processing of materials in several of the largest manufacturing industries in the world. For example, in the electronics industry, plasma-based processes are indispensable for the manufacture of very large-scale integrated (VLSI) microelectronic circuits (or chips). Plasma processing is also a critical technology in the aerospace, automotive, steel, biomedical, flat-panel displays, solar cells, and toxic waste management industries. For an overview of the many and varied applications that rely on plasma processing for materials processing, see, e.g., *PLASMA PROCESSING OF MATERIALS, Scientific Opportunities and Technological Challenges,* National Research Council (National Academy Press, Washington, D.C. 1991).

In general, plasma processing involves the creation and maintaining of a plasma, and the application of the plasma to a particular material that is to be processed by the plasma. A plasma is a partially or fully ionized gas containing electrons, ions, and neutral atoms and/or molecules. In a typical plasma processing application, the nonlinear collective interactions of the electrically charged particles with each other, with neutral atoms and molecules, and with electric and magnetic fields, are used to selectively process a particular material that is exposed to the plasma. For example, in a plasma deposition or etching application, the plasma is used to selectively process a semiconductor wafer on which VLSI microelectronic circuits are being formed.

In plasma deposition, and many other plasma processing applications, one of the technological challenges that must be addressed is the control of "particles" and "particulates" in the plasma. (Note, as used herein, the terms "particle" and "particulate" are used as synonyms.) A "particle" is generally considered as a small piece of material that is larger than a cluster of a few molecules, but small enough to remain suspended in a fluid for a time. A "particle" may originate from a source external to the plasma, or may be formed within the plasma due to the physical and chemical processes occurring within the plasma.

While the presence of certain types of particles may be advantageous to some kinds of plasma processing operations, e.g., because the particles help promote a desired chemical or physical process carried out during the plasma processing operation, most particles are not advantageous. When a particle or particulate is not advantageous to the plasma process it is referred to as a "contaminant". Dust particles are an example of contaminants that interfere with the delicate plasma etching operation used in making VLSI chips. See, e.g., Donovan, *Particle Control For Semiconductor Manufacturing* (Marcel Dekker, Inc. New York 1990). The presence of a dust particle having a size less than about 1 $\mu$m (where one $\mu$m is $10^{-6}$ meters), for example, renders most VLSI processing impossible, where circuit traces and other component sizes and spacings on the VLSI chip may only be on the order of 0.35–1.0 $\mu$m. Hence, contaminants as small as 0.1 $\mu$m may present a problem with the precise deposition and/or etching that must be achieved in most VLSI processing applications. Thus, there is a critical need in the plasma processing art for a way to remove and/or control the presence and/or location of contaminants in the plasma so that such contaminants do not interfere with the plasma processing operation being performed.

Several techniques are known in the art for removing contaminants from the plasma that originate from sources external to the plasma. Generally, such techniques, e.g., filtering the gases used to form the plasma, have proven effective at reducing the density of such contaminants to manageable levels. A significant need still persists, however, for eliminating or minimizing the presence of internally-formed contaminants, i.e., contaminants that originate from particles formed within the plasma itself due to the physical and chemical processes occurring within the plasma. The present invention is directed to this need.

To conceptually understand how contaminants are formed within a plasma, reference is made to FIG. 1A, which schematically illustrates a plasma-formation device 20. As seen in FIG. 1A, the plasma formation device includes opposing electrodes 22 and 24, each of which is connected to a voltage potential source 26. By introduction of appropriate gases into the region between the electrodes, and by application of an appropriate potential to the electrodes, a plasma 28 is formed. Such plasma 28 is made up of electrons and ions. At the same time that the ions and electrons in the plasma are spent, e.g., as they are attracted to and strike the electrodes and/or interact with other elements and/or a workpiece being processed by the plasma, new electrons and ions are also formed. Hence, the generation of the plasma, and the loss of the plasma, is a continual process. As this continual process proceeds, the plasma, as a whole, is maintained at a potential that is positive with respect to the chamber wherein the plasma is confined, yet the plasma itself tends to stay electrically neutral. To remain electrically neutral, the electron flux leaving the plasma must generally be equal to the positive ion flux leaving the plasma. Because electrons are smaller and lighter than ions, and have a significantly higher thermal velocity than do ions, the electrons tend to diffuse out of the plasma much faster than the heavier and slower ions. However, to achieve a charge balance within the plasma, an ambipolar electric field $E_A$ is created that tends to also drag the positive ions out of the plasma, as well as to retard the escape of electrons from the plasma. This causes the plasma potential to be positive relative to the vessel or chamber wherein the plasma is formed. Because the plasma potential is positive relative to the vessel or chamber wherein the plasma is formed, negative ions tend to get trapped within the plasma. Such negative ions thereafter serve as nucleation points for dust particles and other contaminants within the plasma.

Further, it is noted that any particulates in the plasma are also charged negatively. As the particulate grows from the nucleation site, due to its presence in the plasma, it begins to acquire a large negative charge. The plasma charges up the particulate negatively because there is an initial large net negative flux to the particle. This occurs because the electrons, being lighter, have a larger thermal velocity than the positively charged ions. As the particle charges up, it begins to repel the electron current and the charging process is slowed. The charging ceases in equilibrium when the negative current and positive current to the particle exactly cancel. What is left, though, in equilibrium is a large negative charge on the particle. This will occur even if the nucleation site is a neutral gas molecule, atom, or a positive ion. Thus, no matter what the initial nucleation site may be, the particulates quickly become trapped within the plasma. Once trapped, further particle growth occurs due to agglomeration and the particle can become large enough to cause damage to the workpiece.

Further, when negatively-charged particulates are present in the plasma, such particulates limit the rate at which certain plasma deposition processes can be carried out. There is thus a need in the art for a plasma source that removes such negatively-charged particulates so that the plasma deposition and other processes can be carried out at a more rapid rate.

The trapping of negative ions, and subsequent formation of contaminants within a plasma, has been demonstrated, both through modeling and experimentation. See, Hollenstein, et al., "Diagnostics of Particle Genesis and Growth in RF Silane Plasmas by Ion Mass Spectrometry and Light Scattering," NATO Advanced Research Workshop on *Formation, Transport and Consequences of Particles in Plasmas,* Chateau de Bonas, France, Aug. 30–Sep. 3, 1993. Further, once contaminants have been formed within the plasma, e.g., from negative ions that have been trapped within the plasma, various techniques have been proposed for moving them out of the plasma. See, e.g., Selwyn, Gary S., "Plasma particulate contamination control. I. Transport and process effects," *J. Vac. Sci. Technol. B,* Vol. 9, No. 6, pp. 3487–92 (1991); Selwyn et al., "Plasma particulate contamination control. II. Self-cleaning tool design," *J. Vac. Sci. Technol. A,* Vol. 10, No. 4, pp. 1053–59 (July/August 1992). Such techniques thus address a problem—how to deal with negatively-charged particulates/contaminants in the plasma—that exists because negative ions and negatively-charged particulates have become trapped in the plasma. A better approach to solving the overall contaminant problem would be to prevent negative ions from ever becoming trapped in the plasma in the first place, as well as to remove negatively-charged particulates from the plasma in their early formation stages. The present invention takes this latter approach.

SUMMARY OF THE INVENTION

The present invention addresses the above and other needs and solves the internally-formed contaminant problem within a plasma by preventing negative ions and negatively-charged particulates from ever becoming trapped in the plasma. Such trapping is prevented through the use of special plasma-formation apparatus that uses a plasma chamber having a unique electrode and electrode-biasing configuration that advantageously controls the plasma potential. Such configuration maintains the plasma formed in the chamber positive with respect to a first set of electrodes placed at opposite ends of the chamber, yet allows the plasma to be negative with respect to a second set of electrodes placed along opposing sides of the chamber. A magnetic field, having magnetic field lines perpendicular to the faces of the first set of electrodes, is generated using a pair of Helmholtz coils placed around the chamber. The magnetic field strength is carefully controlled to be sufficiently weak to allow negatively- and positively-charged ions, or negatively-charged particulates, in the plasma to escape across the magnetic field lines to the second set of electrodes, yet sufficiently strong to prevent electrons from escaping to the second set of electrodes. That is, electron flow in the plasma is restricted by the magnetic field to flow along the magnetic field lines, but ion-flow and particulate flow or movement is not so restricted.

The restriction of electron flow to flow along the magnetic field lines, in combination with the higher thermal velocity of the electrons (which allows electron current to dominate ion current in the plasma), causes the plasma to respond to the potential applied to the first set of electrodes much more than it does to the potential applied to the second set of electrodes. As a result, the plasma potential is effectively controlled by the potential applied to the first set of electrodes. This allows the plasma potential to be controlled by application of an appropriate potential to the first set of electrodes so that the plasma is maintained slightly positive with respect to the first set electrodes (as is required in any plasma formation device), yet at the same time allows the potential of the plasma to be controllable with respect to the potential applied to the second set of electrodes. In particular, the plasma may be made negative with respect to the second set of electrodes so that any negative ions will be lost from the plasma to the second set of electrodes before such ions are able to serve as nucleation points for contaminants.

Advantageously, with the plasma being made negative with respect to the second set of electrodes, not only are negative ions lost from the plasma, but any negatively-charged particulates that may be in the plasma (from whatever source) are also drawn out of the plasma. Such negatively-charged particulates will typically be very small, i.e., in their early formation stages (and thus not too much larger than many negative ions), when they are drawn out of the plasma, thereby preventing the growth of such particulates to sizes that could be detrimental to the particular plasma processing application being employed.

The plasma-formation apparatus of the present invention thus includes a plasma formation chamber within which two pairs of opposing electrodes are placed. Opposing faces of one pair of the electrodes is substantially orthogonal to the opposing faces of the other pair of electrodes. The first pair of electrodes is generally referred to as the control electrodes, with one end electrode being placed at each end of the plasma formation chamber. A longitudinal axis aligns the two control electrodes with each other. The other pair of electrodes is referred to as the reference electrodes, with one reference electrode being placed along opposing sides of the plasma formation chamber. A lateral axis aligns the two reference electrodes with each other. Each reference electrode is connected to a known electric potential. Each control electrode is also connected to an electric potential having a dc component. The dc bias on the control electrodes is negative with respect to that of the reference electrodes. The plasma discharge can be powered by applying an alternating radio frequency (rf) field on the control electrodes. Alternatively, the plasma discharge can be powered by placing the rf field on the reference electrodes. However powered, the resulting plasma has a potential close to the negative dc bias placed on the control electrodes, and is thus negative with respect to the reference electrodes. In this way, any negative ions in the plasma are attracted to the reference electrodes. A uniform magnetic field (B-field) is created by a pair of Helmholtz coils that surround the plasma formation chamber. The B-field has magnetic field lines perpendicular to the faces of the control electrodes, i.e., parallel with the longitudinal axis that aligns the control electrodes with each other. The B-field is sufficiently strong to restrict the movement of electrons within the plasma to movement along the B-field lines, yet sufficiently weak to allow any negative ions in the plasma to be drawn laterally through the B-field lines to the reference electrodes.

It is thus a feature of the present invention to provide a plasma formation device wherein negative ions and negatively-charged particulates are not allowed to become trapped in the plasma, but are drawn out of the plasma as soon as they are formed.

It is a further feature of the invention to provide a plasma source wherein the plasma is not positive relative to all portions of the chamber within which the plasma is formed, but wherein at least one electrode is maintained at a potential that is slightly positive relative to the plasma (i.e., the plasma is negative relative to such electrode) so that any negative ions or negatively-charged particulates in the plasma are attracted to such electrode.

It is another feature of the invention to provide such a plasma source wherein the potential of the plasma (i.e., whether it is positive or negative relative to the chamber within which it is formed) can be controlled through application of an external bias potential to a control set of electrodes.

It is an additional feature of the invention to provide such a plasma source as above-described that can be used to control the plasma potential, and remove negative ions and negatively-charged particulates therefrom, regardless of how the plasma discharge is powered (rf, microwave, etc.)

It is another feature of the invention to provide a plasma formation device that minimizes the formation of internally-formed contaminants within the plasma.

It is yet an additional feature of the invention to provide a plasma source wherein the plasma potential is controlled by a bias potential applied to a first pair of opposing electrodes, and wherein the formation of internally-formed contaminants within the plasma is prevented, and negatively-charged particulates are removed, by drawing such negative ions and negatively-charged particulates out of the plasma to a second pair of opposing electrodes, which pair is maintained at a potential that is positive with respect to the plasma potential.

It is still a further feature of the invention to provide a plasma processing apparatus, and method of controlling the same, that produces "clean" plasma (relatively contaminant free plasma) that can be used for a wide variety of applications, including VLSI processing, flat panel displays, and solar cells; and wherein such "clean" plasma allows many of the plasma processing steps, e.g., plasma deposition, to be carried out at a more rapid rate than has previously been possible.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1A:
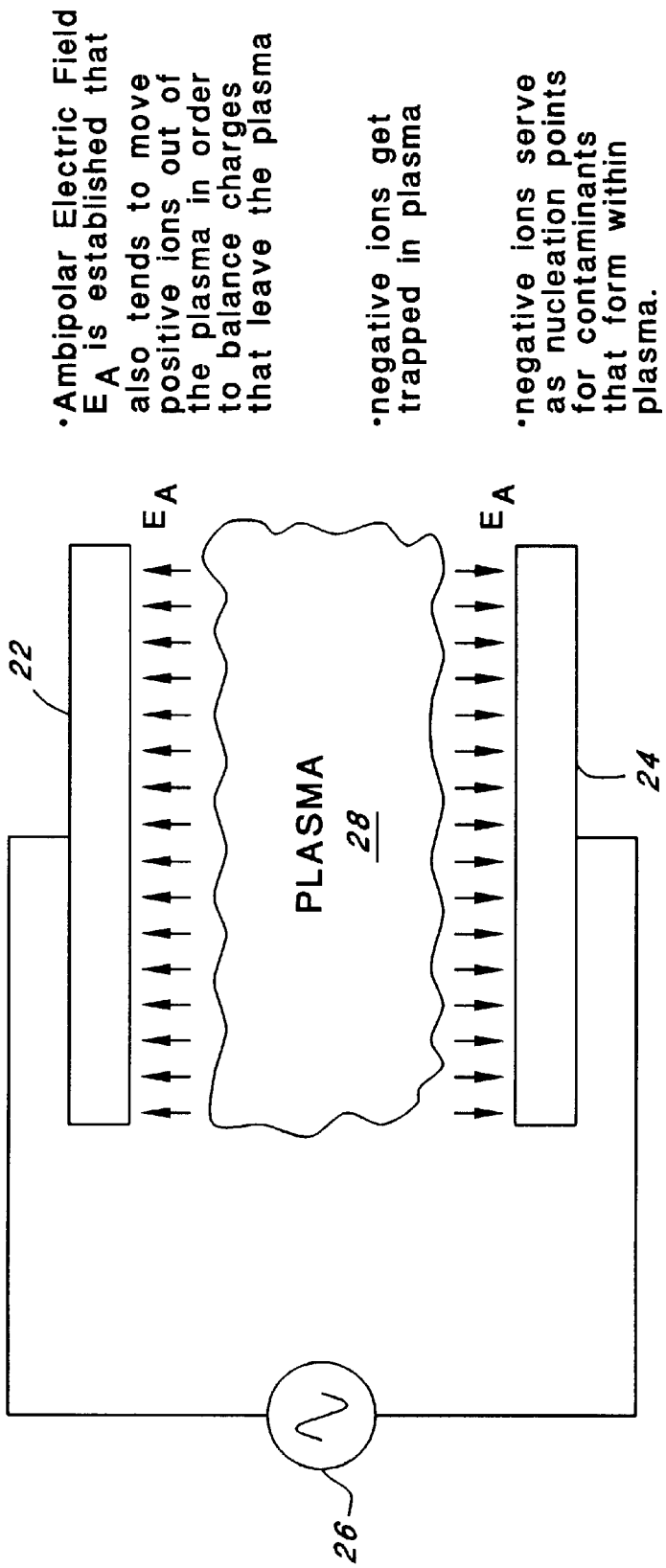
FIG. 1A is schematic diagram of a prior-art plasma processing apparatus.

FIG. 1A shows a schematic diagram of a prior-art plasma formation apparatus. FIG. 1A was described above in the "Background of the Invention" section of this application.

Figure 1C:
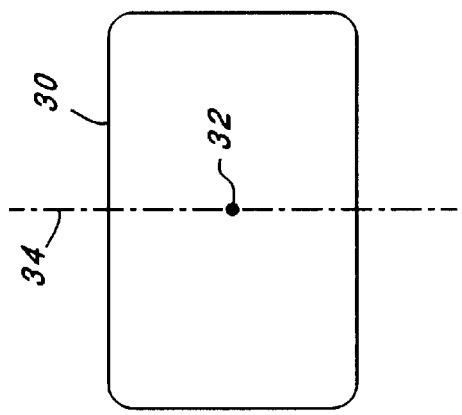
FIGS. 1B and 1C depict a plasma formation chamber of the type used with the present invention and define the longitudinal and lateral axes used therewith.
Figure 1B:
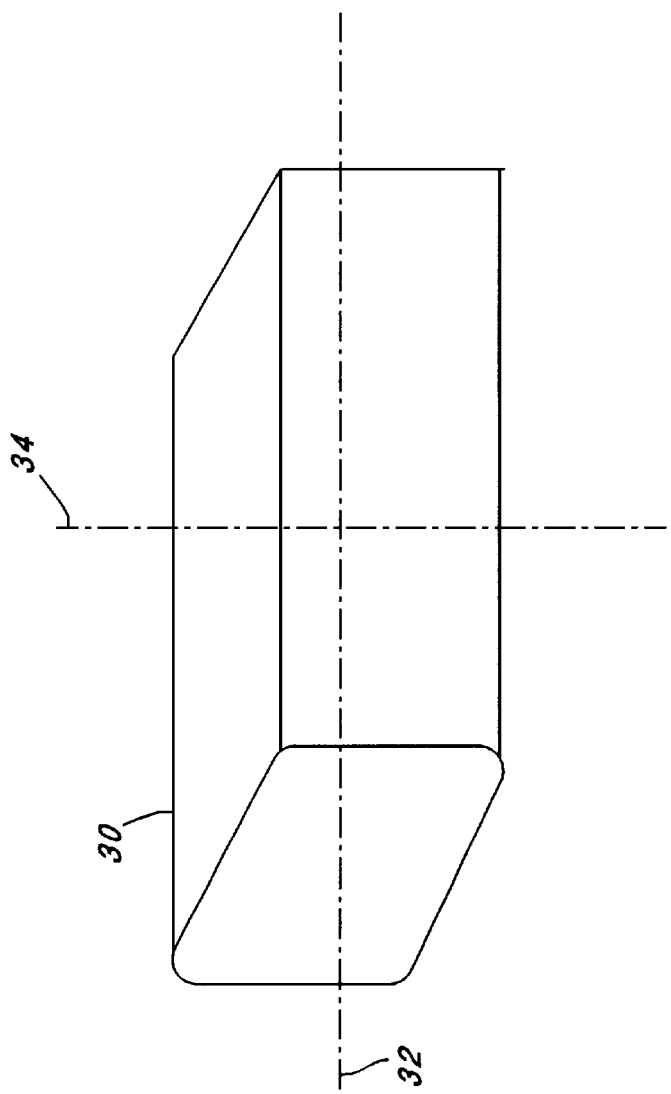

FIGS. 1B and 1C depict side and end views, respectively, of a plasma formation chamber 30 of the type that may be used with the present invention. The chamber 30 has a longitudinal axis 32 and a lateral axis 34. The lateral axis 34 is orthogonal to the longitudinal axis 32. (The lateral axis 34 may be considered equivalent to a radial axis for symmetrical chamber shapes, e.g., cylinders or tubes.) While the plasma formation chamber 30 may be that of a rectangular-shaped channel, as shown in FIGS. 1B and 1C, it is to be understood that other types of shapes and configurations may also be employed for the chamber 30 while still achieving the overall purposes and goals of the invention —to prevent negative ions and negatively-charged particulates from becoming trapped in the plasma, and thereby to prevent internally-formed contaminants from developing and/or remaining within the plasma. For many applications, the shape of the plasma chamber will be dictated by the shape of the workpiece, or other element, to which the plasma is exposed, which workpiece or element must conveniently fit within such chamber. For other applications, the shape of the plasma chamber may be dictated as a function of available materials and cost.

The description of the invention that follows teaches the structure of the plasma-formation apparatus needed to practice the invention. The explanation of the how the invention works that follows is intuitive.

Figure 2:
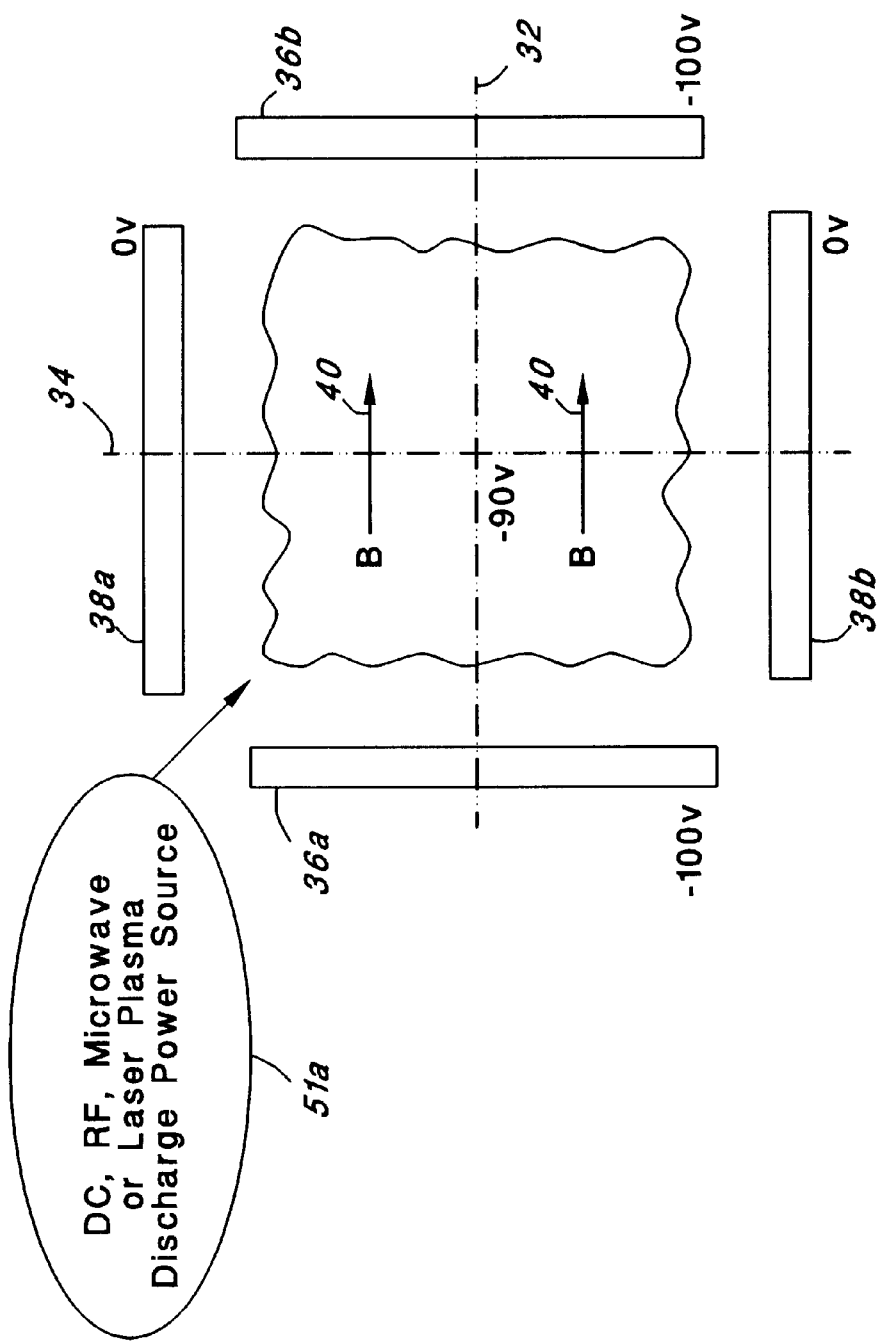
FIG. 2 is a simplified schematic diagram of a plasma source and shows representative relative potentials that need to be maintained between the plasma and the electrode pairs used with the present invention, as well as the orientation of the magnetic field B used with the invention.

Referring to FIG. 2, a simplified schematic diagram of a plasma source made in accordance with the present invention is shown. FIG. 2 is greatly simplified in that many components of a plasma formation device are omitted. Only the plasma 28, a first pair of electrodes 36a and 36b, a second pair of electrodes 38a and 38b, and a magnetic field B are shown. The magnetic field B is represented in FIG. 2 by the arrows 40. Note that the plasma 28 is formed within the region or zone bounded by the electrode pairs 36a, 36b, and 38a, 38b. As seen in FIG. 2, the electrode pair comprising electrodes 36a and 36b is aligned with the longitudinal axis 32 so that the plasma-facing surface of electrode 36a faces the plasma-facing surface of electrode 36b. Similarly, the electrode pair comprising electrodes 38a and 38b is aligned with the lateral axis 34 so that the plasma-facing surface of electrode 38a faces the plasma-facing surface of electrode 38b. Such an electrode arrangement may hereafter be referred to as "opposing paired orthogonal electrodes".

For the reasons set forth in more detail below, the potential applied to the electrode pair 36a, 36b (hereafter the "control electrodes") controls the potential of the plasma 28. The B field 40 must be oriented such that its magnetic field lines are approximately perpendicular to the plasma-fronting surfaces of each control electrode 36a and 36b. The other pair of electrodes, 38a and 38b, are referred to hereafter as the "reference electrodes".

A plasma 28 is formed by introducing a selected gas into the plasma-formation region intermediate the opposing paired orthogonal electrodes, and by creating and powering a plasma discharge with power source 51a in the gas as is known in the art. (Note, the formation or creation of a plasma is referred to as "plasma discharge"). For example, a plasma discharge may be initiated and maintained by applying an appropriate steady or oscillating potential between at least one of the pairs of electrodes. Radio frequency (rf) and/or microwaves may also be used to power the plasma discharge. Microwave energy, or laser energy, may be coupled into the plasma formation chamber in order to power the plasma discharge. Rf, d.c., microwave, laser, or other energy may be used to power a plasma discharge, and the plasma thus formed may then be leaked into the plasma formation chamber of the present invention. Indeed, there are numerous techniques and methods known in the art for initiating and sustaining (powering) the plasma discharge, any of which may be used with the present invention. See, e.g., U.S. Pat. Nos. 5,361,016; 5,359,621; and 5,225,740, incorporated herein by reference.

Still with reference to FIG. 2, once the formation of the plasma 28 is initiated, or concurrently therewith, the control electrode pair 36a, 36b is biased with a negative potential, for example −100 volts, as shown in FIG. 2. The plasma 28 always assumes a potential that is positive relative to the control electrodes 36a and 36b. Thus, in this example, the plasma is shown at a potential of −90 volts. Without an escape mechanism as is provided by the present invention, any negative ions formed within the plasma 28 or any negatively-charged particles therein, would become trapped within the plasma 28 because the plasma is biased positive relative to the control electrodes. Once trapped, such negative ions could serve as a nucleation point for contaminants in the plasma, and such negatively-charged particles could serve as agglomeration points from which comtaminants could grow within the plasma.

In accordance with the present invention, however, negative ions or negatively-charged particulates are not allowed to become trapped within the plasma 28 because the reference electrodes 38a and 38b are biased with a potential that is more positive than the plasma itself (0 volts in this example). Such electrodes thus serve as a loss surface for the negative ions and negatively-charged particulates in the plasma. Significantly, however, electrons (which are also negatively charged, but which are much smaller and lighter than negative ions or negatively-charged particulates) within the plasma are not allowed to escape out of the plasma to the reference electrodes 38a and/or 38b. This is because the electrons are not able to cross over the B-field lines 40, particularly when the B-field is of sufficient magnitude. Hence, so long as the B-field 40 is present, movement of electrons within the plasma is restricted to longitudinal movement, not lateral movement (where longitudinal and lateral movement is movement that parallels the longitudinal axis 32 or the lateral axis 34). The negative ions and negatively-charged particulates, on the other hand, due to their larger size and mass, are able to cross over the B-field lines 40, particularly when the B-field has a magnitude that is not sufficiently strong to block their lateral movement. Thus, it is seen that the B-field must have a magnitude that is not too strong, else the negative ions and negatively-charged particulates will not be able to cross through the B-field lines 40, but that is also not too weak, else the electrons in the plasma will be allowed to cross over the B-field lines 40. Representative values for the B-field, as measured within the plasma formation region, range from 10 to 500 gauss.

The reason that electrons must not be allowed to cross laterally across the B-field lines is to preserve the control of the plasma potential through the control electrodes 36a and 36b. The plasma potential is controlled by the control electrodes rather than the reference electrodes when the plasma current, resulting from the voltage potential applied to the control electrodes, is dominated by the electron current. Because plasma current density (amp/cm$^2$) is a function of [the charge]×[the number distribution(cm$^{-3}$)]×[the thermal velocity] of the elements that make up the plasma current, and because electrons have a much higher thermal velocity than ions, electron flow thus dominates the determination of current density. Hence, when the electrons are restricted to longitudinal flow (back and forth between the control electrodes 36a and 36b), the dominant current density is likewise restricted to longitudinal flow. Thus, the plasma effectively responds to a controlling potential applied to the control electrodes 36a and 36b much more than it responds to any potential applied to the reference electrodes 38a and 38b. As a result, the plasma potential can be controlled through the control electrodes 36a and 36b, which is a desired goal of the invention, yet negative ions can still escape out of the plasma to the reference electrodes, which is also a desired goal of the invention. These desired goals are achieved so long as a B-field is present that is oriented to have longitudinal field lines 40 and is of sufficient magnitude to block the lateral flow of electrons, yet is of insufficient magnitude to block the lateral movement of negative ions and negatively-charged particulates.

Figure 3:
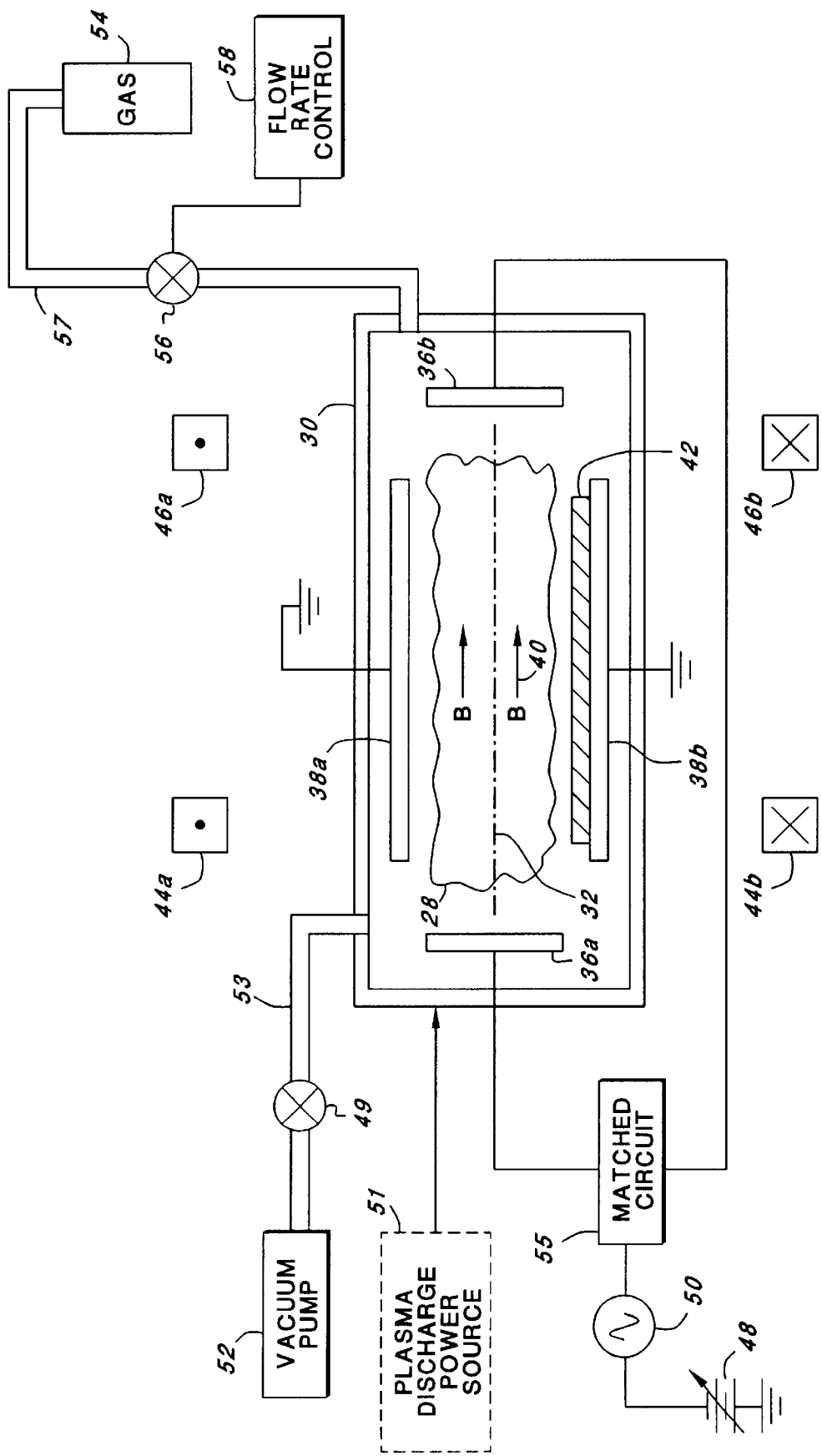
FIG. 3 is a schematic diagram of a plasma processing apparatus made in accordance with the present invention.

Turning next to FIG. 3, a schematic diagram of a plasma processing apparatus made in accordance with the present invention is depicted. The apparatus includes a plasma formation chamber 30 having a longitudinal axis 32 and a lateral axis as described above. Control electrodes 36a and 36b are placed at opposite ends of the chamber 30 aligned with the longitudinal axis 32. Reference electrodes 38a and 38b are similarly placed at opposite sides of the chamber aligned with the lateral axis 34. A pair of Helmholtz coils 44a, 44b and 46a, 46b, positioned so as to be approximately concentric with the longitudinal axis 32, generate the B-field. As illustrated in FIG. 3, the B-field has magnetic field lines 40 that are parallel with the longitudinal axis 32. A source of gas 54 is coupled through appropriate tubing 57 and a control valve 56 to the plasma chamber 30. Similarly, a vacuum pump 52 is connected to the chamber 30 through a throttle value 49 and an appropriate connection line 53. Conventional electronic controls (not shown in FIG. 3) control the operation of the vacuum pump 52, the throttle value 49, and the value 56 so that, upon command, the chamber 30 can be filled with gas from the gas source 54, and a specified pressure can be established within the chamber 30.

The type of gas used with the present invention depends upon the application for which the plasma source is used. A common gas to use for a deposition plasma is $SiH_4$. Such gas, when ionized, breaks down into electrons (e$^-$), and the following ions: $SiH_n^+$, $Si_2H_n^+$, $SiH_n^-$, $Si_2H_n^-$, where n can assume any integer value. Other gases that may be used as the gas source include: $CH_4$, $GeH_4$, $CF_4$, $F_2$, $Cl_2$ Ar, and combinations of the above with $O_2$, $H_2$ and $N_2$. The control valve 56 is controlled by a suitable control device 58 to limit the amount of gas introduced into the plasma formation chamber, which also controls the plasma flow rate. Advantageously, the present invention permits higher plasma flow rates than have heretofore been feasible with less "clean" plasmas. The netrual gas flow rate of a plasma source made in accordance with the present invention may range from 2 to 60 standard cubic centimeters per minute (sccm).

The plasma chamber 30 is typically made from quartz or glass. Alternatively, the chamber can be made from aluminum or stainless steel so long as the plasma current to the chamber is kept small. The electrodes are made from aluminum or stainless steel. The vacuum pump 52 typically maintains an operating pressure of between about 1 mTorr and 1 Torr within the chamber 30.

The size of the chamber 30 is dictated by the size of the workpiece 42 to be processed therein, or by whatever use is to be made of the plasma thus formed. The size of the chamber could range from very tiny, e.g., 0.1 mm width and/or height, to very large, e.g., 100 m or more. Typically, the size of the chamber walls for conventional VLSI plasma deposition applications will range from 10 cm to 1 m.

Still referring to FIG. 3, it is seen that the control electrodes 36a and 36b are each connected to a negative dc voltage source 48 and an ac voltage generator 50 through a matched circuit 55. The frequency of the ac voltage generator 50 ranges from 5 to 50 MHz. The ac generator 50 is used, in this example, to power the plasma discharge. As explained above, other known sources could be used to power the plasma discharge, if desired. The possibility of using such other power sources, which could be rf, microwave, laser, or the like, is represented in FIG. 3 by the alternative power source 51. Whatever source is used to power the plasma discharge, the amount of power needed to initiate and sustain the plasma discharge typically ranges from 5 to 5000 Watts, depending upon the plasma processing application being employed and the size of the workpiece.

Still referring to FIG. 3, each control electrode 36a and 36b is connected to the same negative dc potential. The electrode 36a is connected to one side of the ac generator 50, while the electrode 36b is connected to the other side of the ac generator 50. That is, for the example shown in FIG. 3, the control electrodes 36a and 36b are connected to opposite phases of the same ac signal, so that as electrode 36a swings more positive (from a negative bias point set by the dc power source 48), electrode 36b swings more negative, and vice versa. This opposite-phase arrangement, however, is not necessary for the proper functioning of the invention.

The reference electrodes 38a and 38b are likewise connected to a voltage potential source. In FIG. 3, such source is depicted as a simple ground connection for both electrodes 38a and 38b. It is to be understood, however, that grounding the electrodes 38a and 38b is only an example of one potential (0 volts) that could be applied to these reference electrodes. In practice, any potential that is positive relative to the potential of the plasma could be applied to the reference electrodes. Further, it is not necessary that electrode 38a be connected to the same potential as electrode 38b. Rather, electrode 38a, for example, could be connected to a +10 volt potential source, at the same time that electrode 38b is grounded (connected to 0 volts) or connected to any other potential, as long as there is at least one reference electrode connected to a potential that is positive with respect to the plasma.

For the configuration shown in FIG. 3, a workpiece 42 is placed on the reference electrodes 38b so that such workpiece is exposed to the plasma 28. In this way, the plasma is able to perform a desired processing step associated with the workpiece in conventional manner. If the workpiece is a silicon wafer used to make VLSI integrated circuit chips, then such step may be, e.g., a deposition procedure.

Note also that when the workpiece 42 is positioned on one of the reference electrodes, as shown in FIG. 3, that the negative ions and negatively-charged particulates in the plasma would be attracted to the workpiece. Normally, one would not want particulates to be drawn onto the surface of the workpiece, because such particulates could, if of sufficient size, be a contaminant that could interfere with the plasma processing operation being carried out. However, one of the advantages of the present invention is that such negatively-charged particulates, when present in the plasma, are drawn out of the plasma while they are in their early formations stages, i.e., while they are still very small, and are thus not sufficiently large to function as a contaminant. In the case of negative ion nucleation centers, the negative ions are drawn to the workpiece and also do not function as contaminants. Should larger negatively-charged contaminants be present in the plasma, then the invention provides the flexibility of being able to place a different, e.g., more positive, potential on reference electrode 38a than is placed on reference electrode 38b (where the workpiece is located) so that most of the negative ions and negatively-charged particles would be attracted to the electrode 38a, and thus not deposited on the workpiece.

Figure 4:
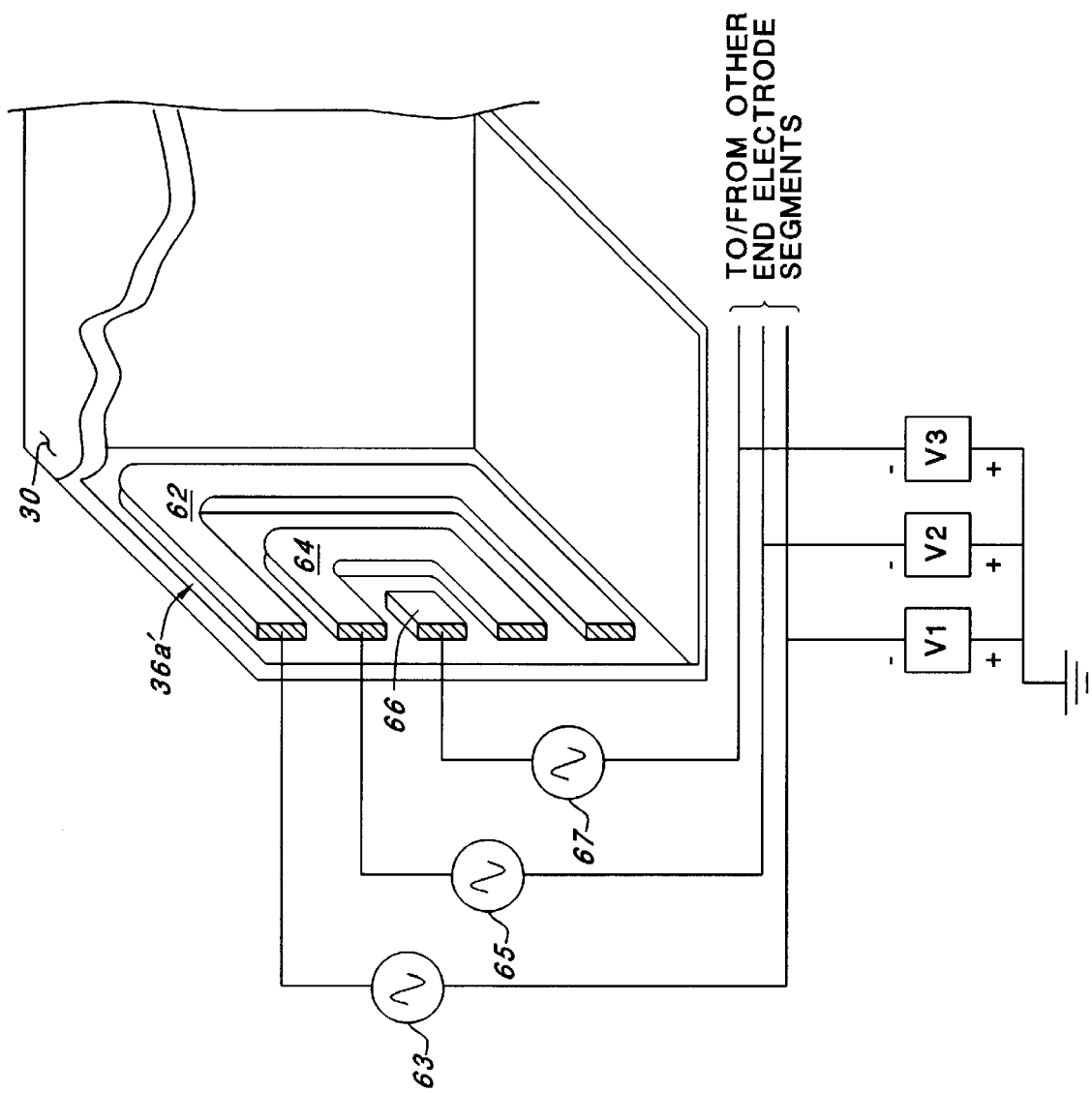
FIG. 4 schematically illustrates how the control electrodes may be segmented in accordance with one embodiment of the invention so that different segments of the control electrode can be biased at different potentials.

Turning next to FIG. 4, there is shown a partial cross-sectional view of one embodiment of an control electrode 36a'. The electrode 36a' is located at one end of the plasma formation chamber 30. It is broken into a plurality of electrically isolated segments 62, 64 and 66. The segments shown in FIG. 4 are concentric rings 62 and 64, with a solid segment 56 in the middle. The use of three segments in this manner is only exemplary, as any number of segments could be used. Further, the segments do not have to be concentric rings, as shown, although concentric rings are preferred.

The use of segments as illustrated in FIG. 4 for the control electrodes allows better control over the electric field that is created between the control electrodes, and hence better control over the plasma potential. In operation, a first bias voltage V1 is applied to the outer segment 62, a second bias voltage V2 is applied to an inner segment 64, and a third bias voltage V3 is applied to a center segment 66. Such bias voltages are preferably selected to provide a gradient bias voltage that increases as the lateral distance from the walls of the chamber 30 increases, with the strongest (highest) bias voltage appearing in the center of the chamber. Thus, e.g., bias voltage V1 may be −20 volts, V2 may be −40 volts, and V3 may be −55 volts.

Each bias voltage has an ac generator connected thereto that superimposes an ac potential on top of the negative bias voltage. That is, an ac generator 63 connects an ac voltage to segment 62 (and connects the opposite phase or matched output of such signal to a corresponding segment at the other end of the chamber 30). Similarly, ac generator 65 connects an ac voltage to the segment 64 (with its opposite phase being connected to a corresponding segment at the other end of the chamber 30); and ac generator 67 connects another ac voltage to the center segment 66 (with its opposite phase being connected to a corresponding center segment at the other end of the chamber 30).

EXAMPLE

A roughly cubical stainless steel plasma chamber having an approximate side dimension of 60 cm was positioned between a pair of Helmholtz coils having a diameter of about 105 cm. The Helmholtz coils were spaced horizontally along the longitudinal axis. The chamber was evacuated with a 350 liter/sec turbomolecular pump through a throttle valve. The residual background pressure was $4\times10^{-8}$ Torr. Each Helmholtz coil had 1600 turns, and was energized with 3 amperes of current. The resulting magnetic field strength at the center of the chamber was 170 gauss.

Reference electrodes comprising aluminum disks 15 cm in diameter were placed in the chamber along the lateral axis so as to be spaced apart 17 cm. The reference electrodes and the plasma chamber were electrically grounded. Control electrodes, comprising aluminum disks 5.1 cm in diameter, and were positioned within the chamber so as to be aligned with the longitudinal axis. The horizontal spacing between the control electrodes was varied depending upon the particular experiment being performed, but typically varied from 15 to 50 cm. In order to limit the electrical influence of the grounded chamber, the control and reference electrodes were enclosed by a quartz cylinder 24 cm in diameter and 58 cm long.

The plasma discharge was powered with a 13.56 MHz rf power supply connected to a matching circuit. The matching circuit converted the single ended rf power generated by the supply into two oppositely phased, impedance matched rf waveforms. These waveforms were then applied to the control electrodes. The forward rf power was approximately 25 Watts.

The electric field structure achieved within the chamber was studied using an argon discharge under a variety of conditions. The argon neutral pressure was varied from 1.5 mTorr to 200 mTorr. Typical flow rates were in the neighborhood of 30 sccm. Negative dc potentials up to $-300$ volts were applied to the control electrodes, and magnetic fields up to 185 gauss were applied. Typical plasma densities and temperatures as measured by a Langmuir probe were on the order to $10^9$ cm$^{-3}$ and 2 to 5 eV. Within the above parameter regime, the floating potential in the center of the plasma as measured by the Langmuir probe could always be made negative with respect to the reference electrode by properly biasing the control electrodes.

Silicon particles were produced by using 100% silane (SiH$_4$) as the working gas in the discharge. Typical Silane pressure were 16 mTorr to 80 mTorr with flow rates around 7 sccm. The particles were detected by light scattering from a HeNe laser. When the control electrodes were grounded, strong light scattering from particles were readily detected throughout the volume of the chamber. The particles appeared to be continuously produced and streamed out of the plasma. When a negative bias was applied to the control electrodes, no more light scattering could be seen, indicating the absence of the particles in the plasma. When a positive bias was applied to the control electrodes, the particles no longer streamed out of the plasma but were concentrated at the center of the discharge. This was expected since the positive bias enhanced the trapping of the negative ions and particles. Particles sampled from the inside of the chamber were approximately 0.1 to 0.5 $\mu$m in diameter and made of pure silicon.

Glass slides were placed inside of the apparatus and the character of the deposition was studied with and without the negative bias on the control electrodes. At a forward rf power of 25 Watts, silane pressure of 16 mTorr, flow rate of 5 sccm, and magnetic field of 170 gauss, a plasma discharge was established with the control electrodes grounded. Photographs of the deposition made with a scanning electron microscope showed a rough, lumpy structure full of large grains on the order to 0.5 to 1 $\mu$m in size. Under the same conditions with a negative bias of $-200$ volts applied to the control electrodes, no particles were seen with the laser and the scanning electron microscope revealed a deposition that was smooth and homogeneous.

While the invention herein disclosed has been described by means of specific embodiments and applications thereof, numerous modifications and variations could be made thereto by those skilled in the art without departing from the scope of the invention set forth in the claims.

What is claimed is:

1. A method of controlling a plasma to prevent negative ions and negatively-charged particulates from becoming trapped within the plasma comprising the steps of:

forming a plasma from a specified gas within a plasma formation chamber, the chamber having control electrodes at each end of the chamber that are aligned with a longitudinal axis of the chamber, and reference electrodes along opposing sides of the chamber that are aligned with a lateral axis of the chamber, at least one of the reference electrodes having a surface on which a workpiece may be supported and with which it is in electrical contact, the lateral axis being substantially orthogonal relative to the longitudinal axis;

biasing the control electrodes with a first bias voltage that includes a negative dc component to control the plasma potential so that the plasma potential is positive with respect to the control electrodes;

restricting electron flow in the plasma to a longitudinal flow that substantially parallels the longitudinal axis, while at the same time allowing a lateral negative ion flow or a lateral negative particulate flow in the plasma, wherein said step of restricting the flow of electrons in the plasma comprises applying a magnetic field of a specified magnitude to the plasma formation chamber that has magnetic field lines that substantially parallel the longitudinal axis, the specified magnitude of the magnetic field restricting the movement of electrons to a direction that substantially parallels the magnetic field lines, while at the same time allowing negative ions and negatively-charged particulates to laterally cross the magnetic field lines; and biasing the reference electrodes with a second bias voltage that is more positive than the plasma, whereby the plasma potential becomes negative relative to the reference electrodes;

whereby negative ions and negatively-charged particulates in the plasma are laterally drawn out of the plasma across the magnetic field lines to the more positively charged reference electrodes and are not allowed to become trapped within the plasma.

2. The method as set forth in claim 1 wherein the step of applying the magnetic field comprises positioning a pair of Helmholtz coils around the plasma formation chamber so that each coil of the pair of Helmholtz coils is approximately concentric with the longitudinal axis, each coil having a radius substantially greater than the width or height of the plasma formation chamber, and each coil being longitudinally spaced from the other coil by a distance approximately equal to the radius of each coil.

3. The method as set forth in claim 2 wherein the step of applying the magnetic field comprises applying a magnetic field having a strength of between 10 and 500 gauss at the longitudinal axis.

4. The method as set forth in claim 2 wherein the step of biasing at least one of the reference electrodes with a second bias voltage that is more positive than the plasma comprises grounding at least one reference electrode.

5. The method as set forth in claim 2 wherein the control electrodes each comprise a segmented electrode having a plurality of electrically insulated segments, and wherein the step of biasing the control electrodes comprises biasing each segment of the control electrodes with a different bias voltage.

6. The method as set forth in claim 5 further including biasing each segment of each control electrode with a negative dc component that is different from the negative dc components with which other segments of the same electrode are biased, but biasing corresponding segments of both electrodes with the same negative dc component.

7. The method as set forth in claim 2 wherein the step of biasing each control electrode includes powering each control electrode with an ac signal having a frequency of from 5 to 50 MHz, said ac signal functioning to power a plasma discharge within the plasma formation chamber.

8. The method as set forth in claim 2 further including introducing microwave energy into the plasma formation chamber in order to power a plasma discharge therein.

9. The method as set forth in claim 2 further including introducing rf energy into the plasma formation chamber in order to power a plasma discharge therein.

10. The method as set forth in claim 2 further including introducing laser energy into the plasma formation chamber in order to power a plasma discharge therein.

11. A method of preventing negatively-charged ions and any negatively-charged particulates from becoming trapped within a plasma, and thereby preventing such negative ions from serving as the nucleation point for contaminants within the plasma, and preventing negatively-charged particulates from serving as the agglomeration point for contaminants within the plasma, said method comprising the steps of:

forming a plasma from a specified gas within a plasma formation chamber, said plasma formation chamber having a longitudinal axis;

restricting electron flow in the plasma to a longitudinal flow that substantially parallels the longitudinal axis by applying a magnetic field of a specified magnitude to the plasma formation chamber that has magnetic field lines that are substantially parallel with the longitudinal axis, the specified magnitude of the magnetic field restricting the movement of electrons to a direction that substantially parallels the magnetic field lines, but allowing heavier negative ions and negatively-charged particulates to laterally cross the magnetic field lines;

controlling the potential of said plasma; and electrically attracting negatively-charged particles out of the plasma in a lateral direction towards a location within the plasma chamber that is more positive than the plasma potential, the lateral direction being substantially orthogonal to the longitudinal axis;

whereby negative ions and negatively-charged particulates are drawn out of the plasma and are prevented from being trapped therein; and whereby contaminants are prevented from forming within the plasma.

12. The method as set forth in claim 11 wherein the step of controlling the plasma potential comprises:

placing a control electrode inside of the plasma formation chamber at each end thereof that is aligned with the longitudinal axis, and applying an electrical potential between the control electrodes to control the plasma potential.

13. The method as set forth in claim 12 wherein the step of forming the plasma further includes initiating a plasma discharge within the plasma formation chamber by coupling energy thereinto from a power source belonging to the group of rf, microwave, and laser power sources.

14. The method as set forth in claim 11 wherein the step of applying the magnetic field comprises applying a magnetic field having a strength of between 10 and 500 gauss.

15. The method as set forth in claim 11 wherein the step of electrically attracting negative ions and any negatively-charged particulates out of the plasma comprises:

placing a pair of reference electrodes inside the plasma formation chamber such that each reference electrode of the pair faces the other and so that a lateral axis passes through a center point of each reference electrode, with the lateral axis being orthogonal to the longitudinal axis, and applying a voltage potential to at least one of the reference electrodes that is positive relative to the plasma potential within the plasma, whereby negative ions and any negatively-charged particulates within the plasma are attracted to the more positively charged reference electrodes.

16. The method as set forth in claim 12 wherein the step of placing a control electrode at each end of the plasma formation chamber comprises placing a segmented control electrode having a plurality of independent segments at each end of the plasma formation chamber, and applying a different electrical potential to respective segments of the plurality of segments of each control electrode.

17. A method of removing negatively-charged ions or other particles from a plasma so that such negatively-charged ions or other particles are not available to serve as nucleation or agglomeration points for contaminants within the plasma, the method comprising inserting a gas in a plasma formation chamber and initiating and sustaining a plasma discharge therein that creates a plasma, said plasma having a plasma potential associated therewith, said plasma formation chamber having a longitudinal axis and a set of control electrodes at opposite ends of the chamber aligned with the longitudinal axis, and a set of reference electrodes at opposite sides of the chamber;

creating a magnetic field having magnetic field lines that parallel the longitudinal axis;

applying a first electric potential between the set of control electrodes, said first electric potential having a dc component;

applying a second electric potential between the reference electrodes which draws negatively-charged ions or other particles out of the plasma across the magnetic field lines to the reference electrodes;

controlling the polarity and magnitude of the dc component of the first electric potential so that the plasma potential remains positively charged relative to the set of control electrodes and negatively charged relative to the set of reference electrodes, the dc component of the first electric potential causing a current density to flow in the plasma, the current density being dominated by electrons that are constrained by the magnetic field lines to flow only longitudinally;

whereby negatively-charged ions or other particles are removed from the plasma.

18. The method of claim 17 wherein the step of initiating and sustaining a plasma discharge within the plasma formation chamber comprises coupling energy into the plasma formation chamber from a power source that belongs to the group of rf, microwave, and laser power sources.

19. The method of claim 17 wherein the step of applying the second electric potential comprises grounding at least one of the reference electrodes.

20. Plasma formation apparatus comprising:
- a plasma formation chamber having a longitudinal axis extending from one end to the other, and a lateral axis extending from one side to the other;
- a source of gas;
- means for introducing the gas into the plasma formation chamber;
- means for initiating and sustaining a plasma discharge within the plasma formation chamber;
- means for creating a B-field within the plasma formation chamber having B-field lines substantially parallel to the longitudinal axis;
- opposing control electrodes through which the longitudinal axis passes;
- means for applying a first dc electrical potential between the control electrodes to control the dc potential of the plasma;
- opposing reference electrodes through which the lateral axis passes;
- means for applying a second dc electrical potential to the opposing reference electrodes, said second dc electrical potential being positive with respect to the plasma and any negatively-charged ions or particulates in the plasma; and
- wherein the magnitude of the B-field prevents movement of electrons in the plasma across the B-field lines to the reference electrodes, yet allows negatively-charged ions or particulates in the plasma to move laterally across the B-field lines to the reference electrodes;
- whereby electron flow in the plasma is restricted to longitudinal flow, which prevents electrons from being attracted to the reference electrodes and altering the plasma potential; and
- whereby negatively-charged ions and particulates are removed from the plasma by being attracted to the more positive potential of the reference electrodes;
- whereby negatively-charged ions and particulates are not trapped in the plasma, and are thus not available to serve as nucleation points or agglomeration points for the formation of contaminants within the plasma.

21. The plasma formation apparatus of claim 20 wherein the means for creating a B-field comprises a pair of Helmholtz coils positioned concentric with the longitudinal axis, each Helmholtz coil having a diameter substantially greater than the width of the plasma formation chamber.

22. The plasma formation apparatus of claim 21 wherein the Helmholtz coils produce a uniform B-field in the plasma formation chamber of between 10 and 500 gauss.

23. The plasma formation apparatus of claim 20 wherein the source of gas comprises a gas selected from the group $SiH_4$, $GeH_4$, $CH_4$, $CF_4$, $Cl_2$, $F_2$, $O_2$, $N_2$, $H_2$ and Ar.

24. The plasma formation apparatus of claim 20 wherein the source of gas comprises a gas made from various combinations of Si, Ge, Ar, and C with $O_2$, $H_2$, $N_2$, and $F_2$.

25. The plasma formation apparatus of claim 20 further including means for maintaining the operating pressure within the plasma formation chamber to a specified pressure level ranging from 1 mTorr to 1 Torr.

26. The plasma formation apparatus of claim 20 wherein each opposing control electrode comprises a segmented electrode made from a plurality of segments, each segment being electrically insulated from the other segments.

27. The plasma formation apparatus of claim 26 wherein the plurality of segments of each control electrode comprise concentric rings positioned about a center segment.

28. The plasma formation apparatus of claim 26 wherein the means for applying the first dc electrical potential between the control electrodes comprises means for applying separate electrical potentials to each of the plurality of segments of the segmented electrode.

29. The plasma formation apparatus of claim 28 wherein each control electrode is made up of three segments.

30. The plasma formation apparatus of claim 20 wherein the means for applying the second electrical potential to the opposing reference electrodes comprises means for electrically grounding at least one of the opposing reference electrodes.

31. The plasma formation apparatus of claim 20 wherein the means for applying the second electrical potential to the opposing reference electrodes comprises means for applying a different electrical potential to each of the reference electrodes.

32. The plasma formation apparatus of claim 20 wherein one of the opposing reference electrodes serves as a platform upon which a workpiece to be exposed to the plasma is placed.

33. The plasma formation apparatus of claim 20 further including means for maintaining the neutral gas flow rate to between 2 and 60 sccm.

34. The plasma formation apparatus of claim 20 wherein the means for initiating and sustaining a plasma discharge within the plasma formation chamber comprises means for coupling power into the plasma formation chamber from a selected one of an rf, microwave, or laser power source.

35. The plasma formation apparatus of claim 34 wherein the power input to sustain and maintain the plasma discharge from the selected power source ranges from 5 to 5000 Watts.

* * * * *